(12) United States Patent
Hsu

(10) Patent No.: US 11,986,437 B2
(45) Date of Patent: May 21, 2024

(54) HOUSING APPARATUS OF A RECHARGEABLE PHYSIOTHERAPY INSTRUMENT

(71) Applicant: Raymond Hsu, Shenzhen (CN)

(72) Inventor: Raymond Hsu, Shenzhen (CN)

( * ) Notice: Subject to any disclaimer, the term of this patent is extended or adjusted under 35 U.S.C. 154(b) by 386 days.

(21) Appl. No.: 17/579,508

(22) Filed: Jan. 19, 2022

(65) Prior Publication Data
US 2023/0285230 A1    Sep. 14, 2023

(51) Int. Cl.
| | | |
|---|---|---|
| H04B 1/3888 | (2015.01) | |
| A61H 39/00 | (2006.01) | |
| H04M 1/02 | (2006.01) | |
| H04W 4/00 | (2018.01) | |
| H05K 5/03 | (2006.01) | |

(52) U.S. Cl.
CPC .............. *A61H 39/00* (2013.01); *H05K 5/03* (2013.01); *A61H 2201/12* (2013.01)

(58) Field of Classification Search
None
See application file for complete search history.

(56) References Cited

U.S. PATENT DOCUMENTS

| | | | | | |
|---|---|---|---|---|---|
| 8,531,824 | B2* | 9/2013 | Rayner | ................ | A45C 13/002 |
| | | | | | 455/575.8 |
| 8,708,142 | B2* | 4/2014 | Rayner | ................ | H05K 5/0017 |
| | | | | | 455/575.8 |
| 8,955,678 | B2* | 2/2015 | Murphy | ............... | H04B 1/3888 |
| | | | | | 206/320 |
| 9,223,346 | B2* | 12/2015 | Wilson | .................. | G06F 1/1626 |
| 9,253,295 | B2* | 2/2016 | Samsilova | ......... | H01R 13/6205 |
| 9,414,659 | B2* | 8/2016 | Kennard | .............. | H04B 1/3888 |
| 9,432,074 | B2* | 8/2016 | Fathollahi | ......... | B29C 45/14631 |
| 9,438,297 | B2* | 9/2016 | Chu | ................ | H04M 1/724092 |
| 9,559,739 | B2* | 1/2017 | Murphy | ............... | G06F 1/1656 |
| 9,564,941 | B2* | 2/2017 | Lin | ................ | H04M 1/724092 |
| 9,654,166 | B2* | 5/2017 | Watanabe | ............ | H04M 1/026 |
| 9,722,655 | B2* | 8/2017 | Yang | ....................... | G06F 1/189 |
| 9,826,079 | B2* | 11/2017 | Elgrissy | ............... | H04B 1/3888 |
| 9,929,577 | B2* | 3/2018 | Fathollahi | ............. | G06F 3/0482 |
| 2015/0270861 | A1* | 9/2015 | Lin | ........................ | H04M 1/18 |
| | | | | | 455/566 |
| 2020/0274573 | A1* | 8/2020 | Marcum | ............... | H04M 1/185 |
| 2022/0302948 | A1* | 9/2022 | Sternowski | ............. | H02H 9/04 |

* cited by examiner

*Primary Examiner* — Tuan A Tran
(74) *Attorney, Agent, or Firm* — Alexander Chen, Esq.

(57) ABSTRACT

A housing apparatus of a rechargeable physiotherapy instrument, that has a shape of a rounded rectangular prism, is disclosed comprising a back plate that has a shape of a rounded rectangular prism without a top plate, and whose one end comprises a first output interface opening, charging interface opening, a second output interface opening, a first baffle plate, a second baffle plate, a first box-like structure, a second box-like structure, a first spring, and a second spring. The first box-like structure further comprises a first wall and a second wall opposite one another. The second box-like structure further comprises a first wall and a second wall opposite one another.

5 Claims, 7 Drawing Sheets

HOUSING APPARATUS OF A RECHARGEABLE PHYSIOTHERAPY INSTRUMENT

FIELD OF INVENTION

The present invention relates generally to the field of physical therapy instruments, in particular, to a housing apparatus that protects a rechargeable physical therapy instrument and prolongs its service life.

BACKGROUND

Physiotherapy, or physical therapy, is one of the healthcare professions. Physical therapy is provided by physical therapists who promote, maintain, or restore health through physical examination, diagnosis, prognosis, patient education, physical intervention, rehabilitation, disease prevention and health promotion. Physical therapists are known as physiotherapists in many countries. The common impression of the word physiotherapy is the physical exercises to regain functions of a part of the body after a disability of that part.

Physical therapists, or healthcare profession in general, have long used tools to provide needed therapies and help to their patients. For example, the most common tool that is used by almost all physical therapists is the treatment table or chair where a patient would lie down or sit so that the therapists could exam or massage the painful or, generally, disable parts of the body.

With the advent of electronic technologies, and, in general, sciences, ultrasound or electronic devices are used to stimulate human body parts to make them better without applying physical forces on the body. Physiotherapy is relatively safe and much less invasive than drug treatments or surgeries. The effect of physical therapy is still very effective for certain diseases. For example, improving the function of human parts by improving their blood circulation or improving the state of local tissues of the human body.

The current common rechargeable physiotherapy devices have generally two output ports and a charging port. It is known that charging a physiotherapy device while using it can easily cause damage to the internal circuit thereof, and, as a result, malfunction of the device. Obviously, this affects the use experience and service life of the physiotherapy device. Most physiotherapy devices have an instruction label or manual accompanied to advise the users not to charge the devices while using them. However, if the patients are elderly or in pain, it is reasonably foreseeable that they would not pay attention to the instruction and manual.

Thus, it is desirable that the physiotherapy devices have a built-in function that only allow only use or charging at a time.

OBJECTIVE OF THE INVENTION

It is an object of this invention to provide a long lasting physiotherapy device.
It is an additional object of this invention to provide a well and consistent performing physiotherapy device.
It is an additional object of this invention to allow a physiotherapy device to only be used or charged at a time.

SUMMARY OF THE INVENTION

In one aspect of the invention, a housing apparatus is disclosed of a rechargeable physiotherapy instrument, that has a shape of a rounded rectangular prism comprising a back plate that has a shape of a rounded rectangular prism without a top plate, and whose one end comprises a first output interface opening; a charging interface opening that is disposed about the center of the one end; a second output interface opening; a first baffle plate that is disposed between the first output interface opening and the charging interface opening: a second baffle plate that is disposed between the second output interface and the charging interface; a first box-like structure that is disposed inside the housing apparatus between the first output interface opening and the charging interface opening; wherein a partial wall of the first box-like structure and a wall of the one end of the back plate sandwich the first baffle plate and form a groove for the first baffle plate to slide within; a second box-like structure that is disposed inside the housing apparatus between the second output interface opening and the charging interface opening; wherein a partial wall of the second box-like structure and a wall of the one end of the back plate sandwich the second baffle plate and form a groove for the second baffle plate to slide within; wherein the first box-like structure further comprises a first wall and a second wall opposite one another; wherein the second box-like structure further comprises a first wall and a second wall opposite one another; a first spring that is encased in the first box-like structure; a second spring that is encased in the second box-like structure. In one embodiment, the invention applies to all instrument apparatus that requires the same limitation as rechargeable physiotherapy instrument where charging and using are not to be used at the same time.

In one embodiment, the first baffle plate closes the first output interface opening; wherein the first baffle plate further comprises a semicircular cutout at its one end that covers the first output interface; wherein the second baffle plate closes the second output interface opening; wherein the second baffle plate further comprises a semicircular cutout at its one end that covers the second output interface opening. In another embodiment, the housing further comprises a first off-center T bracket that is attached to one flat side of the first baffle plate; and a second off-center T bracket that is attached to one flat side of the second baffle plate. In yet another embodiment, the housing further comprises a first opening that is disposed on the end of the back plate between the first output interface opening and the charging interface opening, and a first handle that is attached to the first baffle plate on its one flat side and disposed within the first opening, and, similarly, a second opening that is disposed on the end of the back plate between the second output interface opening and the charging interface opening, and a second handle that is attached to the second baffle plate on its one flat side and disposed within the second opening. In one embodiment, the invention applies to all instrument apparatus that requires the same limitation as rechargeable physiotherapy instrument where charging and using are not to be used at the same time.

BRIEF DESCRIPTION

The present invention will be understood and appreciated more fully from the following detailed description taken in conjunction with the drawings in which.

DETAILED DESCRIPTION

Figure 1:
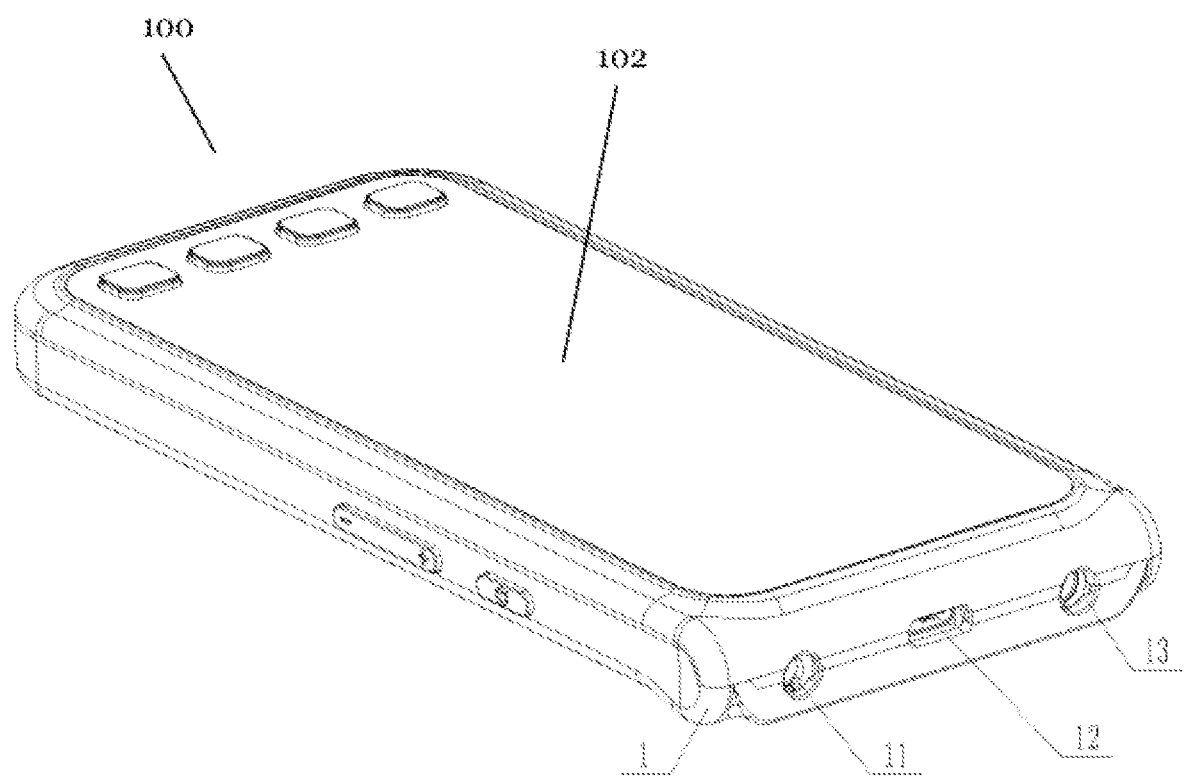
FIG. 1 illustrates an embodiment of the present invention fully assembled.

FIG. 1 illustrates a housing apparatus 100 of the current invention comprising a back plate 1 that is a rounded rectangular prism, and a top plate 102 that is the display of the physiotherapy device. One end of the back plate 1 further comprises a first output interface opening 11, a charging interface opening 12, and a second output interface opening 13, The output interface openings are symmetrically disposed on the left and right sides of the charging interface opening 12 which is disposed about the center of the end of the back plate 1, across the width of the back plate 1 and the device.

Figure 2:
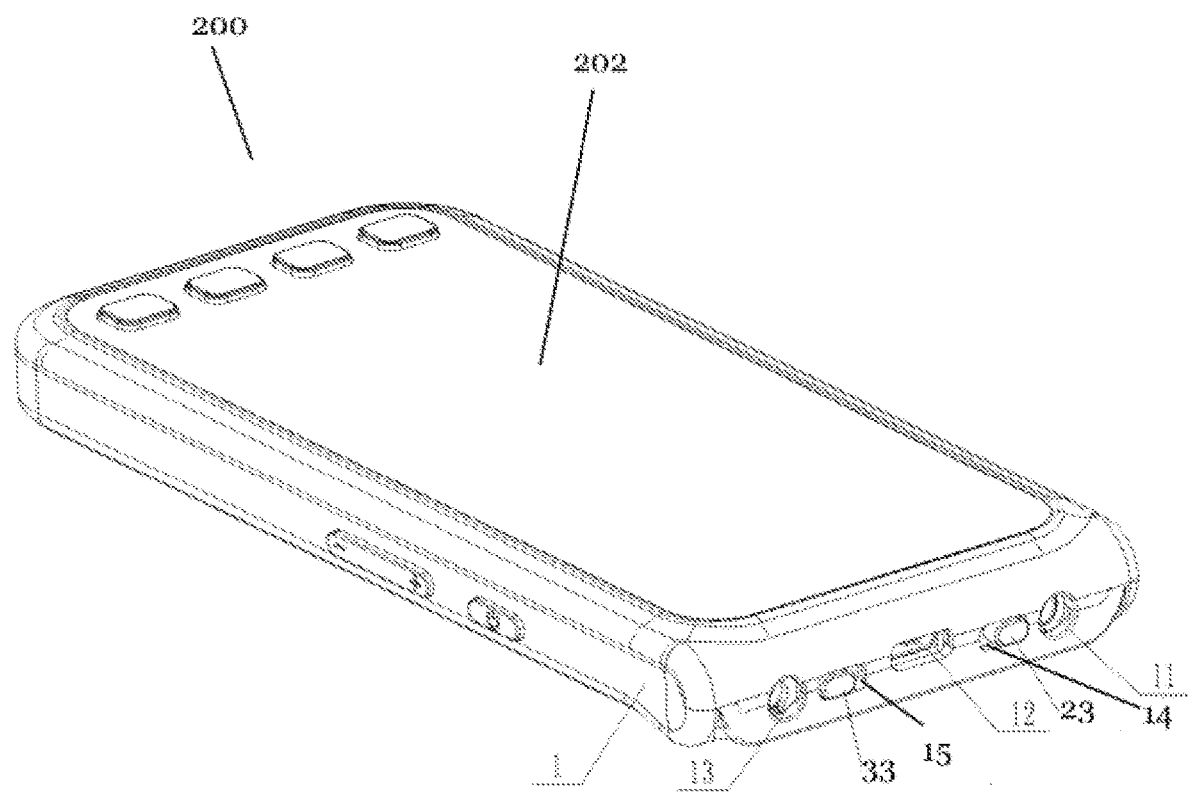
FIG. 2 illustrates another embodiment of the present invention fully assembled.

FIG. 2 illustrates another embodiment of the housing apparatus 200 of the current invention. Similar to embodiment 100 disclosed in FIG. 1, this embodiment comprises a back plate 1 and top display 202. One end of the back plate 1 further comprises a first output interface opening 11, a charging interface opening 12, and a second output interface opening 13, The output interface openings are symmetrically disposed on the left and right sides of the charging interface opening 12, across the width of the back plate 1 and the device. In addition, this embodiment's back plate 1 further comprises a first opening 14 and a second opening 15 to allow, respectively, a first handle 23 and a second handle 33 disposed and slidable therein. The first opening 14 is disposed between the first output interface opening 11 and the charging interface opening 12. The second opening 15 is disposed between the second output interface opening 13 and the charging interface opening 12.

Figure 3:
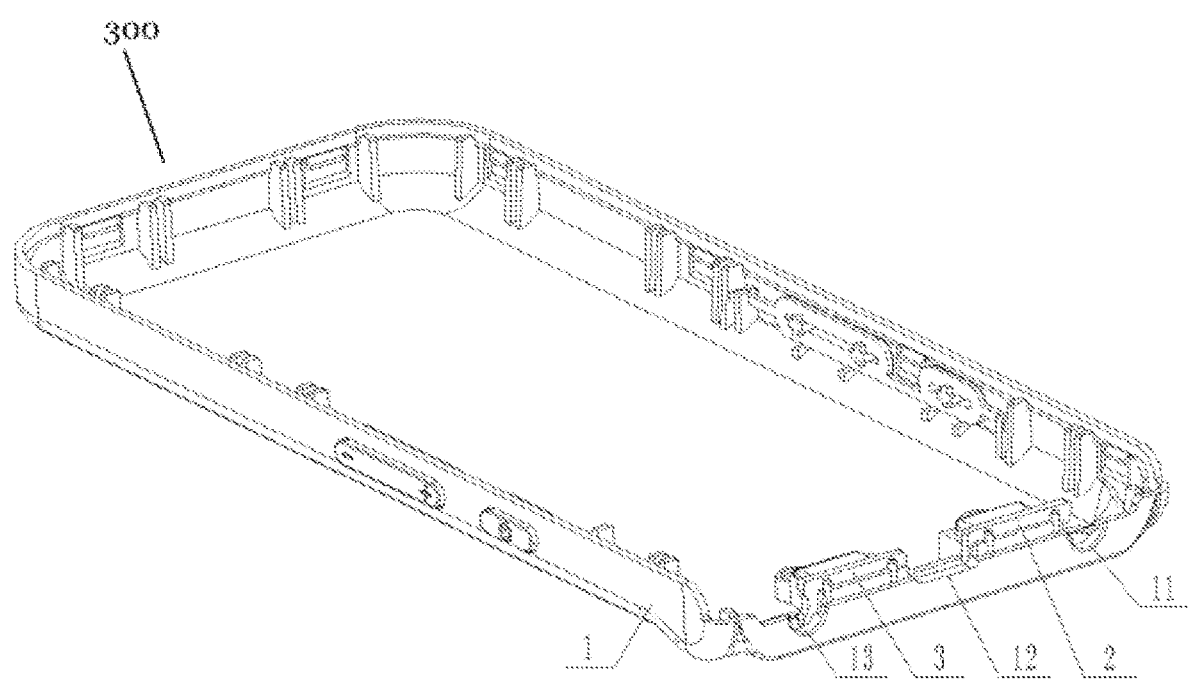
FIG. 3 illustrates a section of an embodiment of the present invention, that comprises the bottom or back plate of the invention without the top plate.

FIG. 3 illustrates a section of an embodiment 300 of the current invention comprising a back plate 1 that is a rounded rectangular prism. One end of the back plate 1 further comprises a first baffle plate 2 and a second baffle plate 3, a first output interface opening 11, a charging interface opening 12, and a second output interface opening 13, The first and second baffle plates, 2 and 3, are slidable along the end of the back plate 1 on the inside of the housing apparatus 100, and guided by a groove that is not shown clearly in this figure, but will be disclosed later herein. The first baffle plate 2 is partially visible through the first output interface opening. Similarly, the second baffle plate 3 is partially visible through the second output interface opening. The baffle plates are positioned to partially or fully close the first and second output interface openings. The first and second baffle plates are rounded rectangles. In one embodiment, the first and second plates' ends, which covers the first and second output interface openings, are semi-circularly cut out to act as flush handles and to aid the unclosing of the output interfaces.

Figure 4:
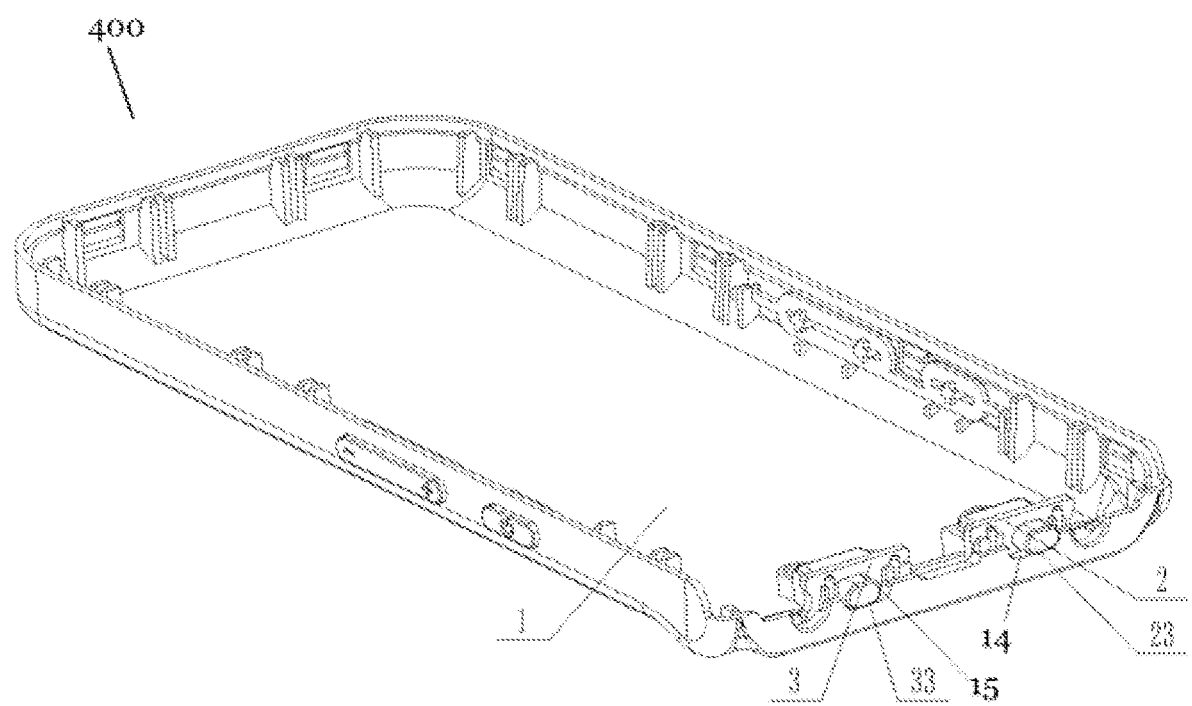
FIG. 4 illustrates a section of an embodiment of the present invention, that comprises the bottom or back plate of the invention without the top plate.

FIG. 4 illustrates another embodiment 400 of the current invention. Similar to the embodiment 300, this embodiment comprises a back plate 1, whose one end further comprises, among other elements disclosed in embodiment 300, a first baffle plate 2 and a second baffle plate 3, a first opening 14 for a first slidable handle 23, and a second opening 15 for a second slidable handle 33. The first baffle plate 2 partially closes the opening to its right, intended for the first output interface. The second baffle plate 3 partially closes the opening to its left, intended for the second output interface. The first and second openings 14 and 15, respectively, limits how much the first and second handles 23 and 33 can slide along the width of the back plate 1.

Figure 5:
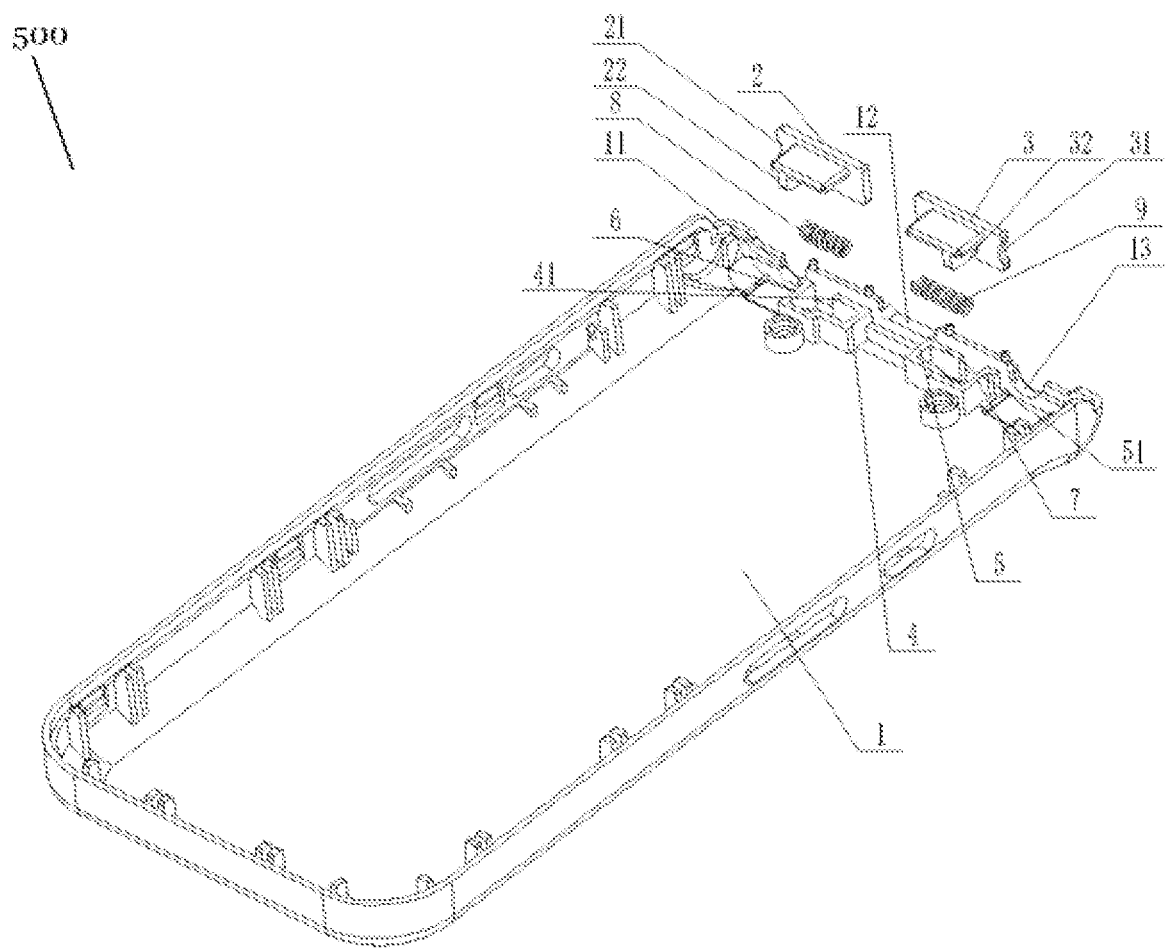
FIG. 5 illustrates an exploded view of a back plate of an embodiment of the present invention.

FIG. 5 illustrates another embodiment 500 of the current invention. Similar to the foregoing embodiments, the embodiment 600 comprises a back plate 1, that is a rounded rectangular prism, without a top plate assembled. One end of the back plate 1 further comprises a first baffle plate 2 and a second baffle plate 3, a first output interface opening 11, a charging interface opening 12, and a second output interface opening 13. The first and second baffle plates, 2 and 3, are slidable along the end of the back plate 1 on the inside of the housing apparatus, and in a groove formed by the walls of a first and second box-like structure, 41 and 51, and the wall of the end of back plate 1. This embodiment 600 further comprises a first off-center T bracket 22, a first flush handle 21, which is a semicircular cutout of an end of the baffle plate 2. Similarly, the embodiment 600 comprises a second off-center T bracket 32, and a second flush handle 31. The first T bracket 22 is attached to the first baffle plate 2 and facing in the housing apparatus. Similarly, the second T bracket 32 is attached to the second baffle plate 3 and facing in. The embodiment 600 further comprises a first spring 8 and a second spring 9 whose, when assembled, one end presses against the vertical plate of the first and second T brackets 22 and 32, and the other end against the walls 4 and 5 of the box-like structures 41 and 51, respectively. As such, the first and second baffle plates 2 and 3 are pushed to close the output interface openings 11 and 13, respectively. As disclosed above, the first baffle plate 2 is partially visible through the first output interface opening 11 and, similarly, the second baffle plate 3 is partially visible through the second output interface opening 13. The first box-like structure 41 comprises one partial wall so that an opening is formed. The first box-like structure 41 is disposed inside the housing apparatus between the first output interface opening 11 and the charging interface opening 12, along the width of the end of the back plate 1. Similarly, a second box-like structure 51 with a similar build is disposed inside the housing apparatus between the charging interface opening 12 and the second output interface opening 13. To constraint the springs' pushing forces, the box-like structures 41 and 51 further comprises a limiting wall, 6 and 7, respectively, to prevent the baffle plates 2 and 3 are pushed too far.

Figure 6:
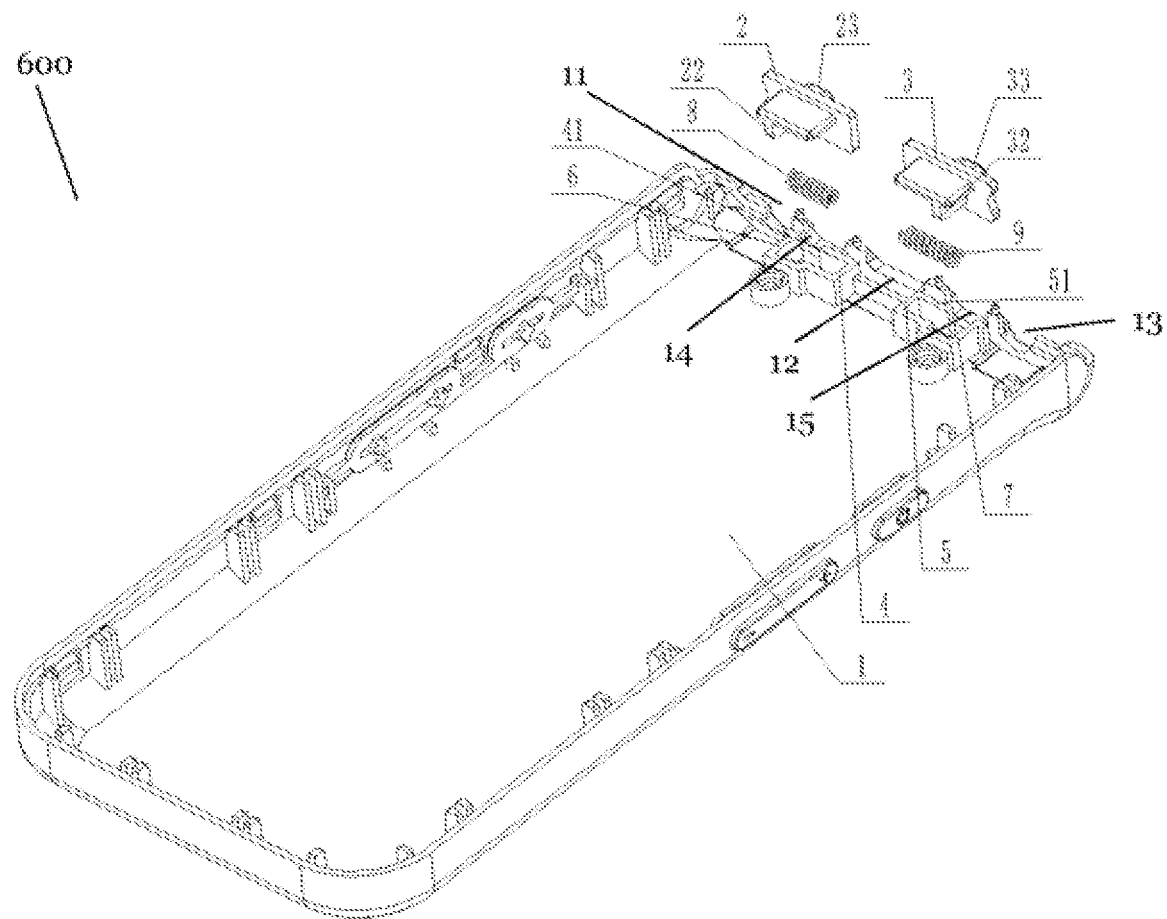
FIG. 6 illustrates an exploded view of a back plate of an embodiment of the present invention.

FIG. 6 illustrates yet another embodiment 600 of the current invention comprising a back plate 1 that is a rounded rectangular prism, without a top plate assembled. One end of the back plate 1 further comprises a first baffle plate 2 and a second baffle plate 3, a first output interface opening 11, a charging interface opening 12, and a second output interface opening 13, The first and second baffle plates, 2 and 3, are slidable along the end of the back plate 1 on the inside of the housing apparatus, in a groove formed by the walls of two box-like structures 41 and 51 and the wall of the end of the back plate 1. This embodiment 500 further comprises a first off-center T bracket 22, a first handle 23, a second off-center T bracket 32, and a second handle 33. The first T bracket 22 and first handle 23 are attached to the first baffle plate 2 with the first T bracket 22 facing in the housing apparatus, and the first handle 23 facing out through the opening 14. Similarly, the second T bracket 32 and second handle 33 are attached to the second baffle plate 3 with the bracket facing in and the handle facing out through the opening 15. The embodiment 500 further comprises a first spring 8 and a second spring 9 whose, when assembled, one end presses against the vertical plate of the first and second T brackets 22 and 32, and the other end against the walls 4 and 5 of the box-like structures 41 and 51, respectively. As such, the first and second baffle plates 2 and 3 are pushed to close the output interface openings 11 and 13, respectively. As disclosed above, the first baffle plate 2 is partially visible through the first output interface opening 11 and, similarly, the second baffle plate 3 is partially visible through the second output interface opening 13. The first box-like structure 41 with one partial wall so that an opening is formed, which is corresponding with the opening 14. The first box-like structure 41 is disposed inside the housing apparatus and behind the opening 14. Similarly, a second box-like structure 51 with similar build is disposed inside the housing apparatus and behind the opening 15 such that its opening corresponds with the opening 15. To constraint the springs' pushing forces, the box-like structures 41 and 51 further comprises a limiting wall, 6 and 7, respectively, to prevent the baffle plates 2 and 3 are pushed too far.

When assembled, the first T bracket 22 is disposed on top of the first box-like structure 41. Its vertical plate is received by the opening of the box-like structure 41's partial wall. Effectively the spring 8 is encased by the box-like structure 41 and the bracket 22. One end of the spring 8 is pressed against the wall 4 of the box-like structure 41, and other end of the spring 8 against vertical plate of the T bracket 22. As disposed, the spring 8 pushes the baffle plate 2 to the right toward the first output interface opening 11. As a result, the baffle plate 2 partially or fully closes the output interface opening 11. To access the output interface 11, the user pushes the handle 23, which as disclosed above disposed within the opening 14 and accessible from outside of the housing apparatus. While pushing the handle 23, which is attached to baffle plate 2, the user slides the baffle plate 2 toward the center and away from the output interface opening 11, and opens up the interface opening 11 completely for access.

Figure 7:
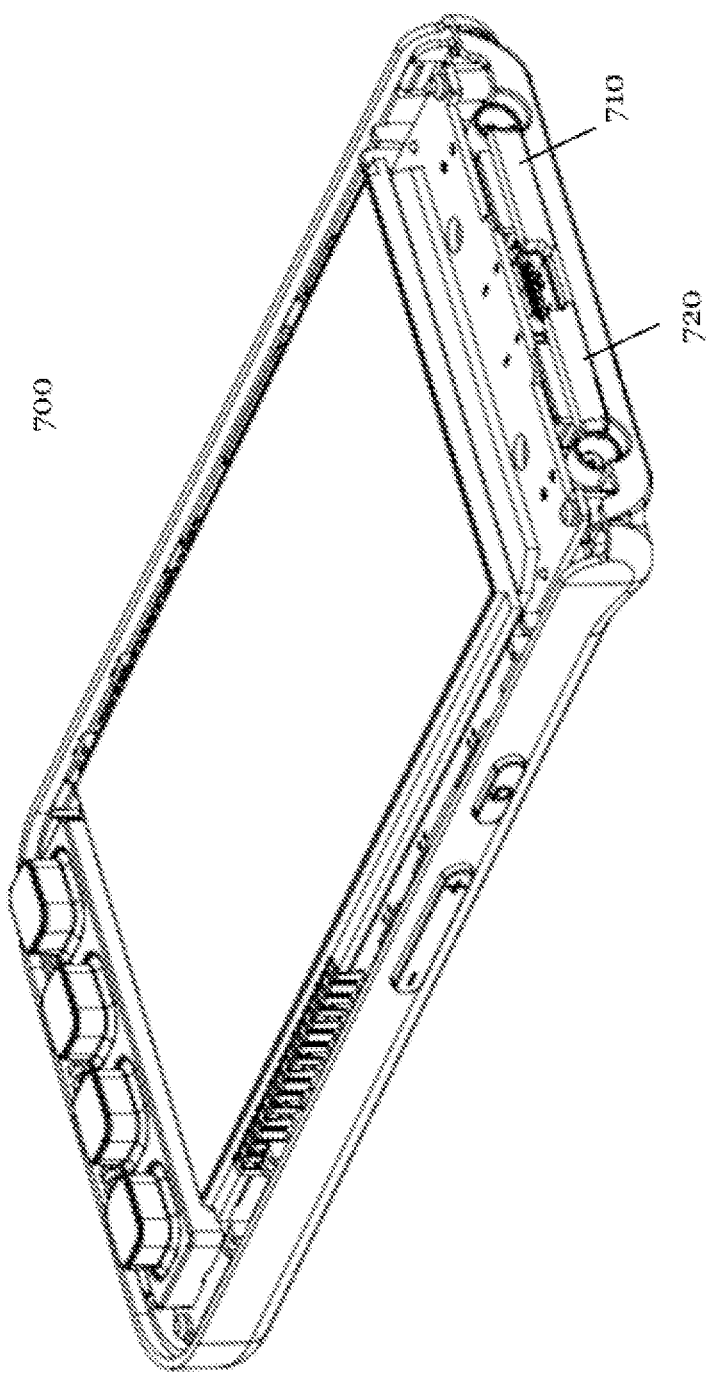
FIG. 7 illustrates another embodiment of the present invention.

In another embodiment 700 of the current invention, depicted in FIG. 7, the whole baffle plates 710 and 720 are exposed, as opposed to the hidden baffle plates in FIG. 6, where only the handles are exposed. These baffle plates 710 and 720 are equivalent to the baffle plates 2 and 3 in FIG. 6. In this embodiment 700, the baffle plates 710 and 720 further comprises one end, disposed close to the output interface opening, that is cut to the shape of a half conical funnel with the large opening facing outward. The large opening of the half conical funnel allows the pin of a connector to be deposited without sliding the baffle plate away from the output interface opening first. As the pin of the connector enters into the output interface opening, it pushes the baffle plate sideways. Certainly, a user could just use his thumb and index finger to slide the baffle plates forth and back to open or close the charging port and the output interface openings. To allow the baffle 710 and 720 to function as the previously disclosed embodiments, other components behind the baffle plates are disposed and function similar to the components disclosed in FIG. 6. A T bracket is attached to the back of the baffle plate, facing in the housing apparatus. A spring is encased by a box-like structure and the T bracket. Thus, when a user causes the baffle plate to slide, the T bracket presses the spring against the box-like structure's wall and causes the spring to store potential energy. When the user's fingers are lifted, the stored energy causes the spring to push the T bracket, and the baffle plate, toward the initial position.

A mirror image of the elements and operation disclosed in the preceding paragraph is made up of the second T bracket 32, the second box-like structure 51 with its wall 5, the spring 9, the handle 33, the second baffle plate 3, and the output interface opening 13.

In one embodiment, the partial walls of the box-like structures 41 and 51 function as the counterparts of the limiting walls 6 and 7, disclosed above, to prevent the baffle plates 2 and 3 to slide too far away from limiting walls 6 and 7.

In another embodiment, the width of the openings 14 and 15 function as the counterparts of the limiting walls 6 and 7, disclosed above, to prevent the baffle plates 2 and 3 to slide too far by constraining the handles 23 and 33's movement within the width of the openings 14 and 15.

In yet another embodiment, the partial walls of the box-like structures 41 and 51, and the width of the openings 14 and 15 function together to prevent the baffle plates 2 and 3 from sliding too far.

As disclosed above, the first and second baffle plates 2 and 3 block the first output interface openings 11 and 13, respectively, and leave the charging interface opening 12 open in the initial, or default, state. This state is also the charging state where the charging interface opening 12 is open. In the charging state, a charging plug prevents the baffle plates 2 and 3 from sliding toward the charging interface and closing the charging interface opening. At the same time, the baffle plates 2 and 3 block the output interface opening 11 and 13 preventing the user from inserting the output lines into the output interfaces.

When the device not being charged and no charging plug to stop them, the baffle plates 2 and 3 are free to slide toward the charging interface opening 12 until they meet in the center or are stopped by the limiting elements, ie., the partial walls or the width of the openings 14 and 15, disclosed in FIG. 5, and close the charging interface opening 12. Due to the pushing forces of the springs 8 and 9, to close the charging interface opening 12 and open the output interface openings 11 and 13, the user must apply a force on the handles 23 and 33, or, alternatively, on the flush handles 21 and 31, to counter the springs' forces. Once output plugs are inserted in first output interface 11 or the second output interface 13, they prevent the baffle plates 2 and 3 from sliding back and returning to the initial/charging state. Blocking the charging interface opening ensures that the device cannot be charged when in use. As such, the device's reliability and safety of use are ensured, and its service life can be effectively increased. Vice versa, when being charged, the device cannot be used because the output interface openings 11 and 13 are blocked, as disclosed above. This also ensures the device's reliability and safety, and prolongs its service life.

What is claimed:

1. A housing apparatus of an instrument, that has a shape of a rounded rectangular prism comprising a back plate (1) that has a shape of a rounded rectangular prism without a top plate, and whose one end comprises a first output interface opening (11); a charging interface opening (12) that is disposed about the center of said one end; a second output interface opening (13); a first baffle plate that is disposed between said first output interface opening (11) and said charging interface opening (12); a second baffle plate that is disposed between said second output interface (13) and said charging interface (12); a first box-like structure that is disposed inside said housing apparatus between said first output interface opening (11) and said charging interface opening (12); wherein a partial wall of said first box-like structure and a wall of said one end of said back plate sandwich said first baffle plate and form a groove for said first baffle plate to slide within; a second box-like structure that is disposed inside said housing apparatus between said second output interface opening (13) and said charging interface opening (12); wherein a partial wall of said second box-like structure and a wall of said one end of said back plate sandwich said second baffle plate and form a groove for said second baffle plate to slide within; wherein said first box-like structure further comprises a first wall (4) and a second wall (6) opposite one another; wherein said second box-like structure further comprises a first wall (5) and a second wall (7) opposite one another; a first spring (8) that is encased in said first box-like structure; a second spring (9) that is encased in said second box-like structure.

2. The housing apparatus of claim 1 wherein said instrument is a rechargeable physiotherapy instrument.

3. The housing apparatus of claim 1, wherein said first baffle plate (2) closes said first output interface opening (11); wherein said first baffle plate further comprises a semicircular cutout (21) at its one end that covers said first output interface (11); wherein said second baffle plate closes said second output interface opening; wherein said second baffle plate further comprises a semicircular cutout (31) at its one end that covers said second output interface opening (13).

4. The housing apparatus of claim 1, wherein said housing further comprises a first off-center T bracket (22) that is attached to one flat side of said first baffle plate; and a second off-center T bracket (32) that is attached to one flat side of said second baffle plate (3).

5. The housing apparatus of claim 1, wherein said housing further comprises a first opening that is disposed on said end of said back plate between said first output interface opening and said charging interface opening, and a first handle (23) that is attached to said first baffle plate on its one flat side and disposed within said first opening, and, similarly, a second opening that is disposed on said end of said back plate between said second output interface opening and said charging interface opening, and a second handle (33) that is attached to said second baffle plate on its one flat side and disposed within said second opening.

\* \* \* \* \*